United States Patent [19]
Crane, Jr. et al.

[11] Patent Number: 6,031,720
[45] Date of Patent: Feb. 29, 2000

[54] COOLING SYSTEM FOR SEMICONDUCTOR DIE CARRIER

[75] Inventors: Stanford W. Crane, Jr., Boca Raton; Lakshminarasimha Krishnapura, Delray Beach; Moises Behar, Boca Raton; Arindum Dutta, Boca Raton; Kevin J. Link, Boca Raton; Bill Ahearn, Boca Raton, all of Fla.

[73] Assignee: The Panda Project, Boca Raton, Fla.

[21] Appl. No.: 08/970,503

[22] Filed: Nov. 14, 1997

[51] Int. Cl.[7] .................................................. H05K 7/20
[52] U.S. Cl. .............................................................. 361/695
[58] Field of Search ........................ 62/259.2; 165/80.3, 165/185, 908; 174/16.3; 257/722; 361/687–690, 694–697, 704, 707

[56] References Cited

U.S. PATENT DOCUMENTS

| | | | |
|---|---|---|---|
| 4,674,004 | 6/1987 | Smith et al. ............................... | 361/695 |
| 5,077,601 | 12/1991 | Hatada et al. ............................ | 361/697 |
| 5,428,503 | 6/1995 | Matsushima et al. .................... | 361/695 |
| 5,563,768 | 10/1996 | Perdue ...................................... | 361/695 |
| 5,597,035 | 1/1997 | Smith et al. .............................. | 361/697 |
| 5,763,950 | 6/1998 | Fujisaki et al. .......................... | 361/697 |
| 5,828,549 | 10/1998 | Gandre et al. ........................... | 361/695 |

*Primary Examiner*—Gregory Thompson
*Attorney, Agent, or Firm*—Morgan, Lewis & Bockius LLP

[57] ABSTRACT

A cooling system for a semiconductor die carrier is disclosed that includes a cooling fan disposed at a substantial distance from a semiconductor die carrier, a cooling duct including an inlet portion and an outlet portion, and a heat exchanger disposed on an upper surface of the semiconductor die carrier. The cooling duct inlet portion is attached to the cooling fan and the cooling duct outlet portion is disposed in close proximity to the heat exchanger. The cooling fan draws ambient air into the cooling duct and the ambient air exits the cooling duct outlet portion and passes in a heat exchange relationship with the heat exchanger.

17 Claims, 7 Drawing Sheets

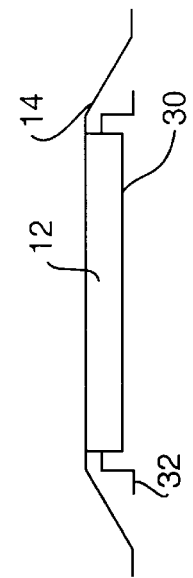
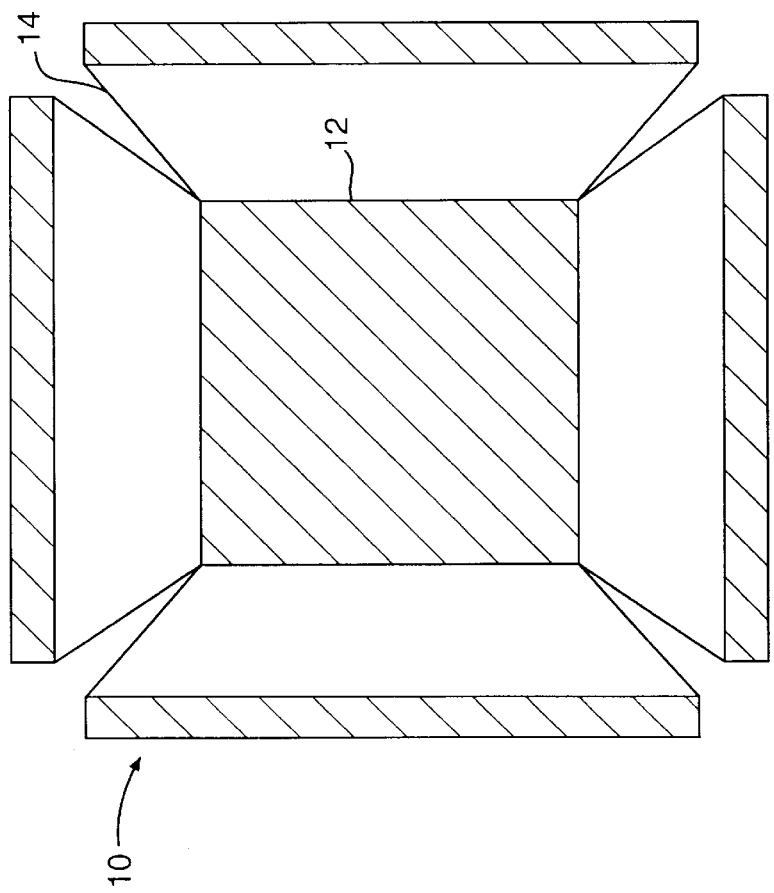

COOLING SYSTEM FOR SEMICONDUCTOR DIE CARRIER

RELATED APPLICATIONS

This application is related to several other patent applications which are commonly owned by the Assignee of this application. Those related applications are: U.S. design patent application, Ser. No. 29/081,929 entitled Computer Cabinet, U.S. patent application, Ser. No. 08/970,379 entitled Multi-Chip Module, U.S. patent application, Ser. No. 08/970,502 entitled Interface Optimized Computer System Architecture, and U.S. patent application, Ser. No. 08/970,434 entitled Decorative Panel for Computer Enclosure, all of which are hereby incorporated by reference.

BACKGROUND OF THE INVENTION

1. Field of Invention

The present invention relates to a cooling system for a semiconductor die carrier.

2. Description of Related Art

Conventional cooling systems for a semiconductor die carrier suffer from several disadvantages. While conventional cooling systems do provide some measure of cooling for semiconductor die carriers, they fail to also provide any protection for the semiconductor die carrier from electromagnetic interference. Furthermore, because conventional cooling systems for semiconductor die carriers do not provide optimum cooling capability for the semiconductor die housed in the carrier, optimum performance cannot be achieved. Conventional cooling systems for a semiconductor die carriers rely on a fan mounted adjacent to the die carrier. This close spatial relationship and limitation on airflow passage size reduces the cooling system's ability to effectively remove the heat generated by the die. Furthermore, conventional cooling systems for semiconductor die carriers rely on the use of warm air from within a computer enclosure to cool the semiconductor die package. Often, the air within the enclosure is subsatntiailly warmer than the ambient air outside the computer enclosure. The performance of a semiconductor becomes degraded as the temperature of the die carrier increases. Thus, the above-referenced disadvantages directly effect the performance of the semiconductor die.

Accordingly, there is a need for a cooling system for a semiconductor die carrier with improved heat dissipation characteristics. Furthermore, there is a need for a system which both provides for the cooling of a semiconductor die carrier and shields the die housed within the die carrier from electromagnetic interference.

SUMMARY OF THE INVENTION

Accordingly, the present invention is directed to a cooling system for a semiconductor die carrier which substantially eliminates one or more of the problems or disadvantages found in the prior art.

An object of the present invention is to provide for a cooling system for a semiconductor die carrier which relies upon cool ambient air from the exterior of a computer enclosure to cool the semiconductor die.

Another objective of the present invention is to provide a cooling system for a semiconductor die carrier which directs the cool ambient air from the exterior of a computer into a heat exchange relationship with the semiconductor die carrier.

Another object of the present invention is to effectively prevent electromagnetic interference from reaching the die housed within the semiconductor die carrier.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these, and other advantages and in accordance with the purposes of the invention, as embodied and broadly described, the invention contemplates a cooling system for a semiconductor die carrier including a cooling fan disposed at a substantial distance from a semiconductor die carrier, a cooling duct including an inlet portion and an outlet portion, the cooling duct inlet portion attached to the cooling fan, an a heat exchanger disposed on an upper surface of the semiconductor die carrier, wherein the cooling duct outlet portion is disposed in close proximity to the heat exchanger such that the cooling fan draws ambient air into the cooling duct and the ambient air exits the cooling duct outlet portion and passes in a heat exchange relationship with the heat exchanger.

It is to be understood that both the general description above, and the following detailed description are exemplary and explanatory and are intended to provide further explanation of the invention as claimed.

BRIEF DESCRIPTION OF THE DRAWINGS

The accompanying drawings which are included to provide a further understanding of the invention and constitute a part of this specification, illustrate embodiments of the invention and together with the written description, serve to explain the principles of the invention. In the drawings:

FIG. 2 is a perspective internal view of an embodiment of the semiconductor package cooling shield in accordance with the present invention;

FIG. 3 is side view of an embodiment of the semiconductor package cooling shield mounted on a semiconductor package in accordance with the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
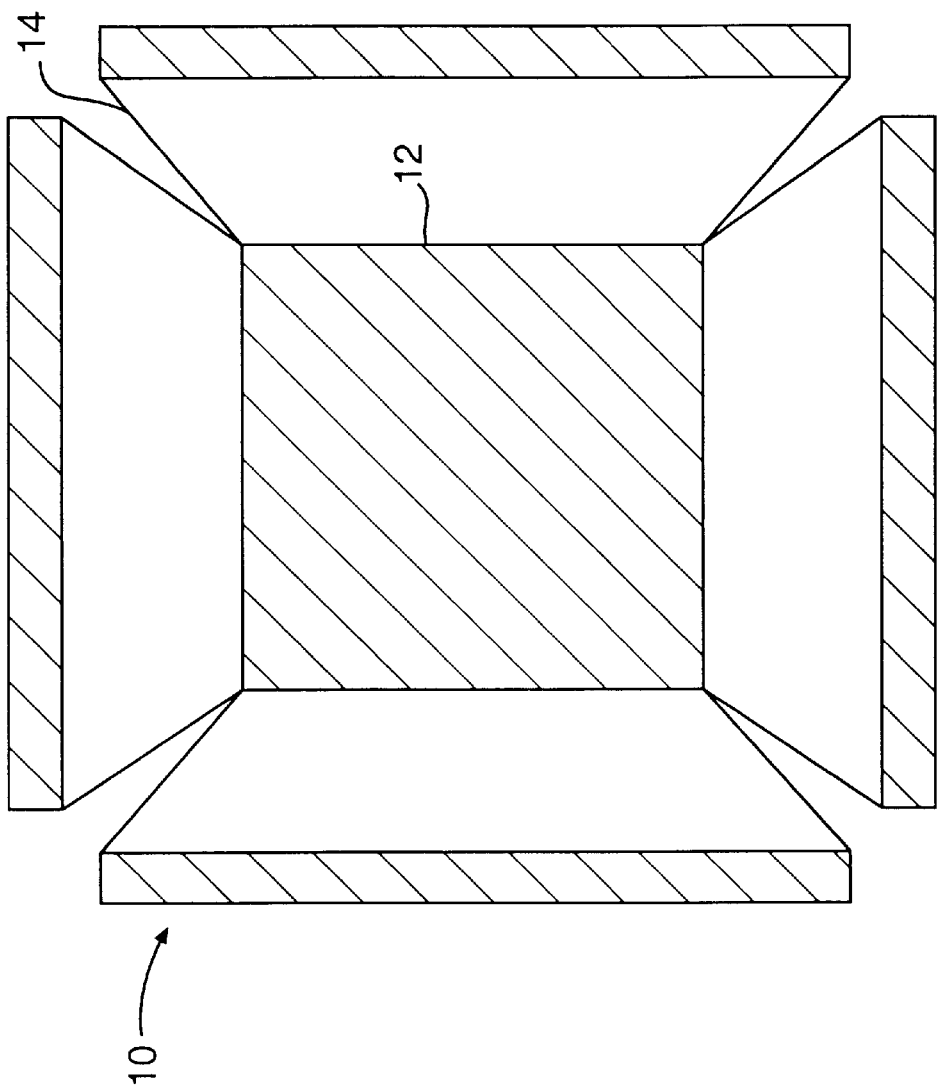
FIG. 1 is an enlarged perspective internal view of an embodiment of the semiconductor package cooling shield in accordance with the present invention.

FIG. 1 illustrates an embodiment of the semiconductor package shield 10 in accordance with the present invention.

The darker areas denote exterior portions that are electrically and/or thermally conductive. The lighter areas show exterior portions that are electrically and/or thermally insulative. The semiconductor package shield 10 includes a central portion 12 adapted for mounting to the top of a semiconductor package and a plurality of extensions 14 connected to the central portion 12. The central portion 12 and the extensions 14 may be formed of a single piece of an electrically and/or thermally conductive material. Preferably, central portion 12 and the extensions 14 may lee formed of copper. A material that is electrically or thermally non-conductive may be laminated over portions of the extensions 14. Of course, the use of a laminate is not required.

As shown in FIGS. 1 and 2, the extensions 14 are substantially coextensive with the sides of semiconductor package 30. The semiconductor package shield 10 thus surrounds the top and sides of the semiconductor package 30, and thereby shields the semiconductor package 30 and package leads 32 from electromagnetic interference.

Figure 4:
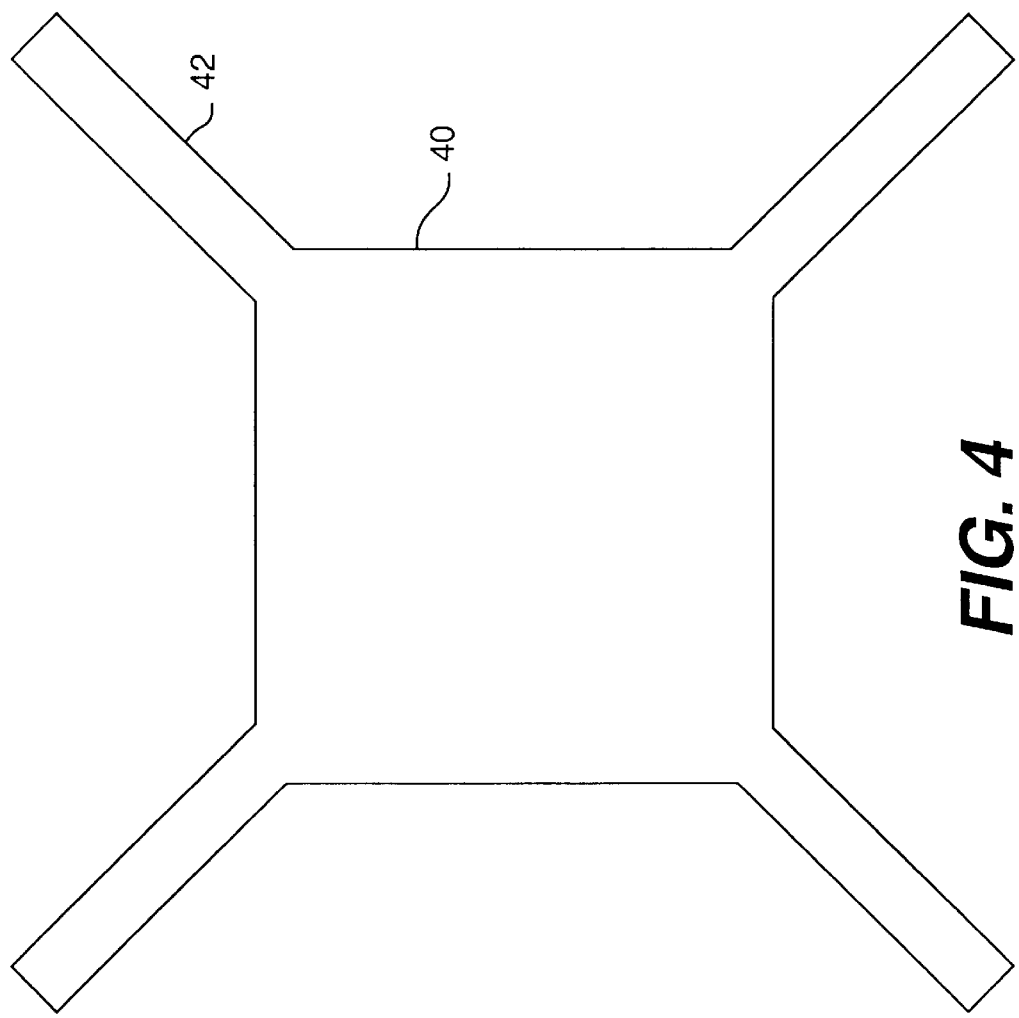
FIG. 4 is a top view of an alternate embodiment of the semiconductor package cooling shield in accordance with the present invention.

Alternatively, FIG. 4 illustrates an alternate embodiment in which extensions 42 are formed as bars that extend outwardly from corners of the central portion 40. The central portion 40 electrically and/or thermally connects to the semiconductor die package 30. Just as with the first embodiment shown in FIG. 3, the extensions 42 of this alternate embodiment bend down over the semiconductor carrier to contact a printed circuit board. Accordingly, an electrical and/or thermal connection is established between the semiconductor die and the printed circuit board.

When used as an electrical shield, the semiconductor package shield 10 may provide an ohmic contact to the printed circuit board. For example, the semiconductor package shield 10 can provide a large capacity ground connection between the semiconductor die package 30 and the printed circuit board. The semiconductor package shield 10 may also conduct heat away from the semiconductor die package 30 to the circuit board. In addition, the semiconductor package shield 10 serves as a cover for the externals leads 32 of the semiconductor package 30. The exterior of semiconductor package shield 10 can also support a heat sink or a fan for providing cooling of the semiconductor device.

In accordance with the objects of the present invention, the cooling system for a semiconductor die carrier includes a cooling fan disposed at a substantial distance from a semiconductor die carrier, a cooling duct including an inlet portion and an outlet portion, the cooling duct inlet portion attached to the cooling fan, an a heat exchanger disposed on an upper surface of the semiconductor die carrier, wherein the cooling duct outlet portion is disposed in close proximity to the heat exchanger such that the cooling fan draws ambient air into the cooling duct and the ambient air exits the cooling duct outlet portion and passes in a heat exchange relationship with the heat exchanger.

Figure 5:
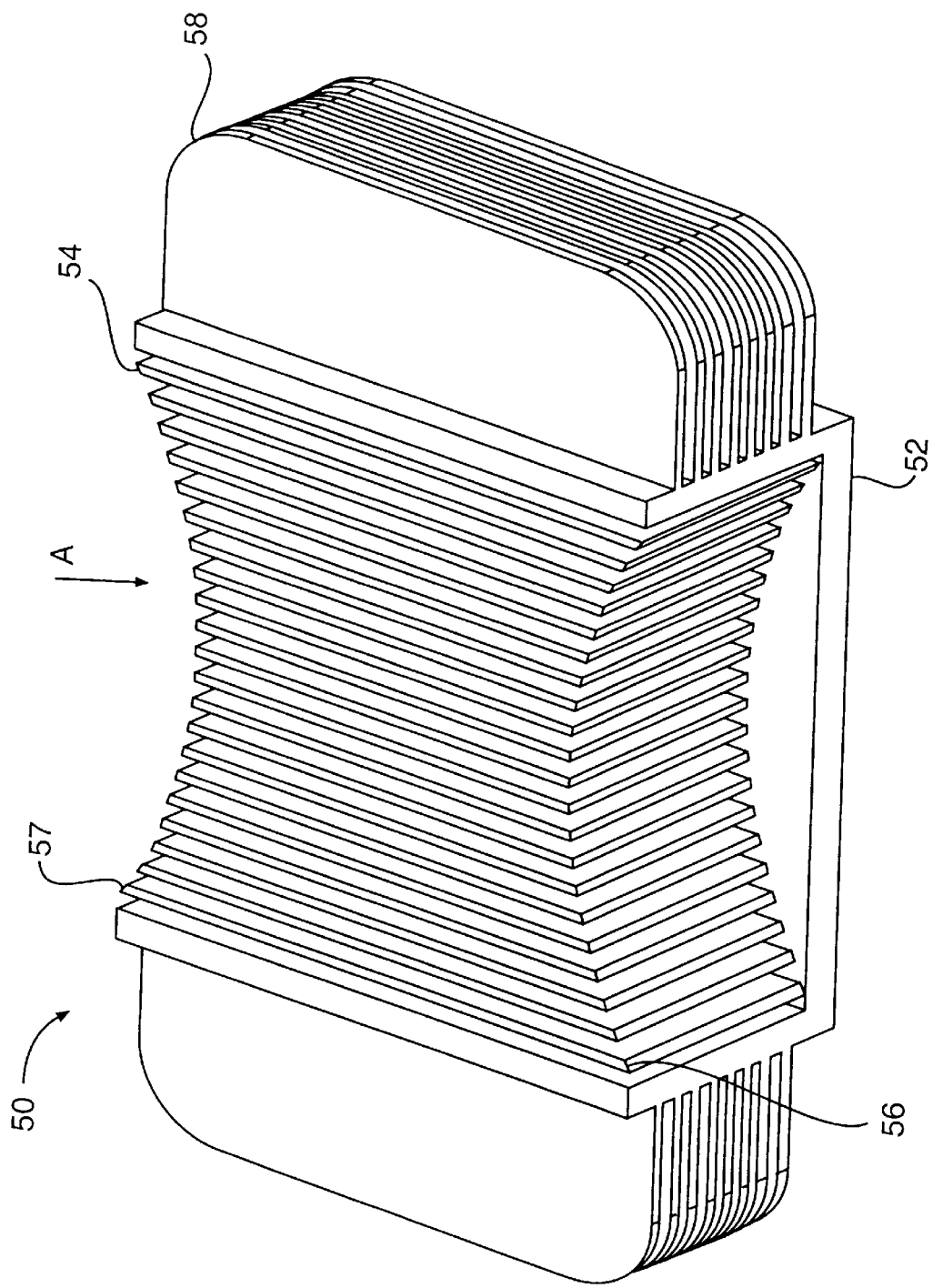
FIG. 5 is an isometric view of a preferred embodiment of a heat exchanger in accordance with the present invention.

FIG. 5 shows an isometric view of a preferred embodiment of a heat exchanger 50 in accordance with the present invention. A heat exchanger according to the present invention includes a contact portion and heat dissipating extensions, wherein the contact portion is adapted to contact an upper surface of a semiconductor die carrier. For example, heat exchanger 50 includes contact portion 52 and first and second groups of fins 54 and 58 respectively. Contact portion 52 is adapted to be mounted to the top surface of a semiconductor die carrier.

A heat exchanger according to the present invention further includes a first and a second group of fins, the first group of fins oriented perpendicularly with respect to the second group of fins. For example, first group of fins 54 are mounted vertically, while second group of fins 58 are mounted horizontally. Furthermore, first group of fins 54 are separated from one another by an air gap so that cooling air may flow freely (along direction A) between the fins. Second group of fins 58 are similarly separated from one another by an air gap so that cooling air may flow freely (along direction A) between the fins.

In accordance with the present invention, each of the first group of fins includes first and second ends, the first ends of the first group of fins being disposed in a curvilinear array. For example, as is illustrated in FIG. 5, first group of fins 54 include first ends 56 and second ends 57. The first ends 56 are arranged in a curvilinear array, while the second ends 57 are also arranged in a curvilinear array. This arrangement facilitates a preferred cooling air flow pattern across heat exchanger 50. Heat exchanger 50 may be constructed of any appropriate heat conductive material. For example, heat exchanger 50 may be constructed of a metal. Preferably, heat exchanger 50 may be constructed of copper or aluminum.

Figure 6:
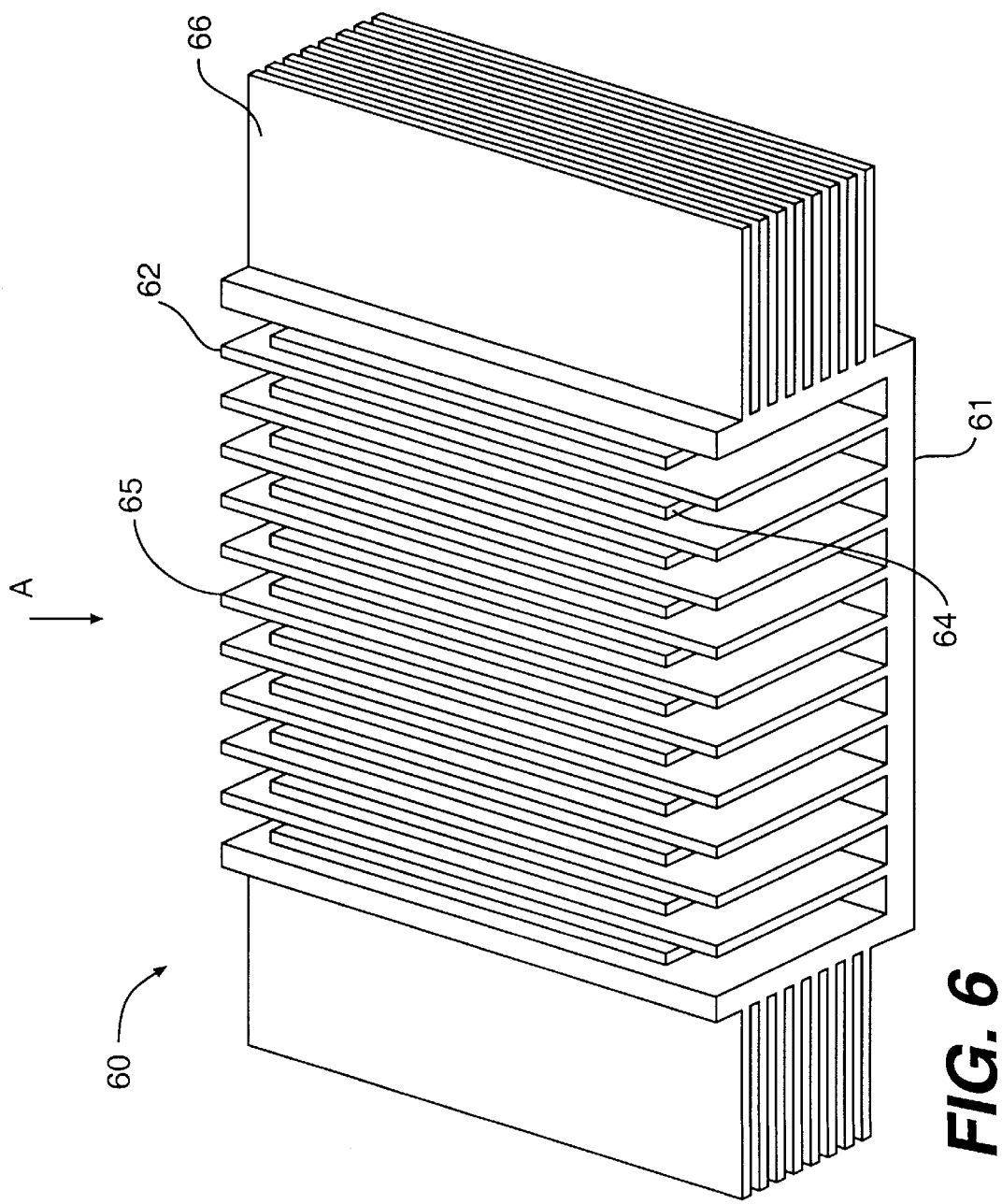
FIG. 6 is an isometric view of an alternate embodiment of a heat exchanger in accordance with the present invention.

FIG. 6 shows an isometric view of an alternate embodiment of a heat exchanger 60 in accordance with the present invention. Heat exchanger 60 includes contact portion 61 and first and second groups of fins 62 and 66 respectively. First group of fins 62 are mounted vertically, while second group of fins 66 are mounted horizontally. Furthermore, first group of fins 62 are separated from one another by an air gap so that cooling air may flow freely (along direction A) between the fins. Second group of fins 66 are similarly separated from one another by an air gap so that cooling air may flow freely (along direction A) between the fins.

In accordance with the present invention, the first group of fins include fins of a first length interspersed between fins of a second length, the first length being shorter than the second length. For example, as shown in FIG. 6, first group of fins 62 includes long fins 65 with short fins 64 interspersed therebetween.

Figure 7:
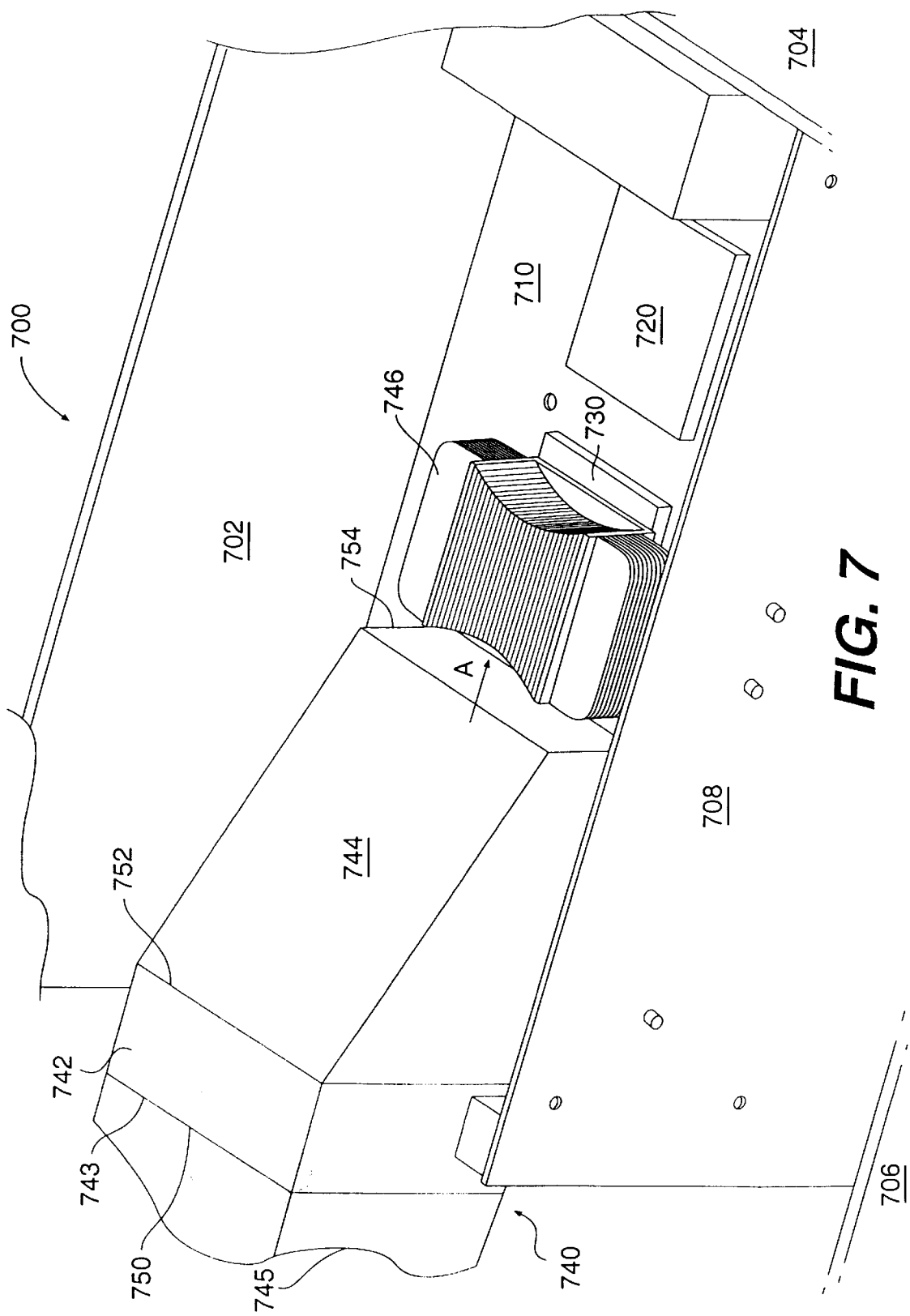
FIG. 7 is a perspective view of a cooling system for a semiconductor die carrier in accordance with the present invention.

FIG. 7 is a perspective view of a cooling system for a semiconductor die carrier in accordance with the present invention. FIG. 7 shows computer enclosure 700 which includes panels 702, 704, and 706. Printed circuit boards (PCBs) 708 and 710 are mounted within computer enclosure 701). Semiconductor die carriers 720 and 730 are mounted to PCB 710.

Figure 8:
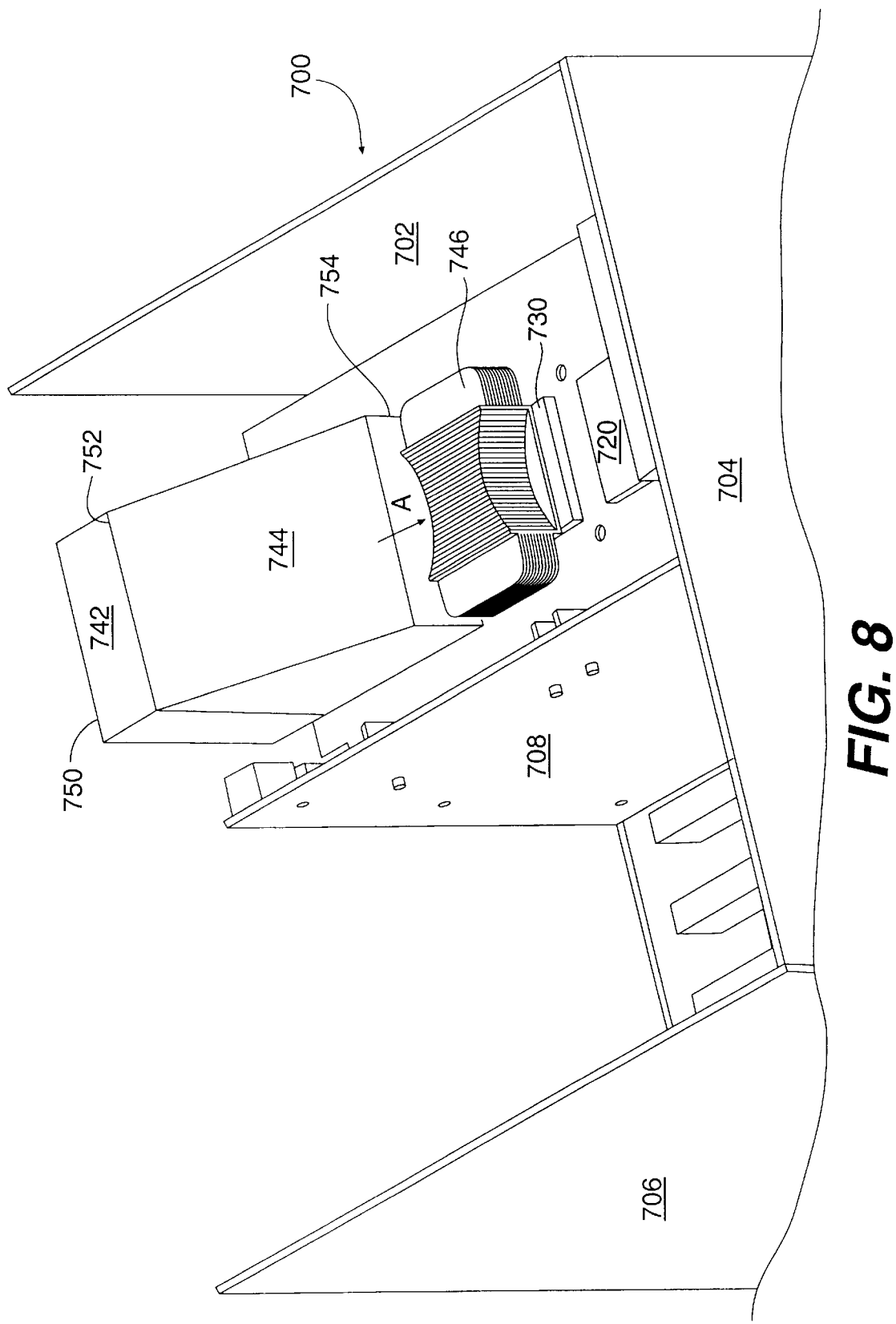
FIG. 8 is an isometric view of a cooling system for a semiconductor die carrier in accordance with the present invention mounted within a computer enclosure.

A cooling system for a semiconductor die carrier according to the present invention includes a cooling fan disposed at a substantial distance from a semiconductor die carrier, a cooling duct including an inlet portion and an outlet portion, the cooling duct inlet portion attached to the cooling fan, and a heat exchanger disposed on an upper surface of the semiconductor die carrier, wherein the cooling duct outlet portion is disposed in close proximity to the heat exchanger such that the cooling fan draws ambient air into the cooling duct and the ambient air exits the cooling duct outlet portion and passes in a heat exchange relationship with the heat exchanger. For example, as shown in FIGS. 7 and 8, semiconductor die carrier cooling assembly 740 includes (cooling fan 742, cooling duct 744, and heat exchanger 746. Preferably the cooling fan 742 of the present invention is mounted directly to an outer surface 743 of a computer enclosure 745 (only a portion of which is shown in FIG. 7 for clarity). However, the cooling fan may be located in numerous other positions/locations without departing from the scope or spirit of the invention in its broader aspects. Cooling duct 744 includes inlet portion 752 and outlet portion 754. Note that cooling, duct inlet portion 752 has a greater cross sectional area than cooling duct outlet portion 754. Thus, optimal airflow characteristics are achieved in the cooling duct 744.

In operation, cooling fan 742 draws in ambient air through inlet 750. Cooling air then passes through inlet portion 752 of cooling duct 744 before exiting cooling duct 744 via outlet portion 754. Cooling air flows in direction A across the heat exchanger 746 and in between the fins of heat exchanger 746. Preferably, ambient air (the phrase "ambient air" generally refers to cooling air which does not originate from within the computer enclosure) flows in a direction which is parallel to the upper surface of the semiconductor die carrier 730. Thus preferably, the axis of fan rotation is also parallel to the upper surface of the semiconductor die carrier 730. However, other appropriate spatial arrangements of the components may be made without departing from the scope or spirit of the invention in its broader aspects. Note that cooling fan 742 is disposed at a substantial distance from semiconductor die carrier 730, for optimal cooling air flow characteristics. A cooling system in accordance with the present invention allows the semiconductor die carrier to be cooled with cooler air (for example 25° C.) from outside the computer enclosure rather than conventional systems in which the semiconductor die carrier is cooled with warmer air (for example 45° C.) from within the computer enclosure.

It will be apparent to those skilled in the art that various modifications and variations can be made in the cooling system for a semiconductor die carrier of the present invention without departing from the spirit or scope of the invention. Thus, it is intended that the present invention cover the modifications and variations of this invention provided they come within the scope of the appended claims and their equivalents.

What is claimed is:

1. A cooling system for a semiconductor die carrier comprising:

a cooling fan disposed at a substantial distance from a semiconductor die carrier;

a cooling duct comprising an inlet portion and an outlet portion, said inlet portion having a first cross-sectional area, said outlet portion having a second cross-sectional area, said first cross-sectional area being greater than said second cross-sectional area, said cooling duct inlet portion attached to said cooling fan; and a heat exchanger disposed on an upper surface of the semiconductor die carrier, wherein said heat exchanger comprises heat dissipating extensions, said heat dissipating extensions comprising a plurality of fins that comprise first and second groups of fins, said first group of fins comprise fins of a first length interspersed between fins of a second length, said first length being shorter than said second length, said cooling duct outlet portion is disposed upstream of and adjacent to an edge of said heat exchanger such that said cooling fan draws ambient air into said cooling duct and said ambient air exits said cooling duct outlet portion and passes along said heat exchanger in a direction parallel to said upper surface of the semiconductor die carrier in a heat exchange relationship with said heat exchanger.

2. The cooling system of claim 1, wherein said cooling fan comprises an axis of fan rotation, said axis of fan rotation being oriented parallel to said upper surface of the semiconductor die carrier.

3. The cooling system of claim 1, wherein said cooling fan is attached to an outer surface of a computer enclosure.

4. The cooling system of claim 1, wherein said first and second cross sectional areas are rectangular in shape.

5. The cooling system of claim 1, wherein said heat exchanger further comprises a contact portion, said contact portion adapted to contact said upper surface of the semiconductor die carrier.

6. The cooling system of claim 5, wherein said first group of fins are oriented perpendicularly with respect to said second group of fins.

7. The cooling system of claim 6, wherein each of said first group of fins comprises first and second ends, the first ends of said first group of fins being disposed in a curvilinear array.

8. The cooling system of claim 7, wherein second ends of said first group of fins are disposed in a curvilinear array.

9. The cooling system of claim 1, wherein said heat exchanger is formed from a metal.

10. The cooling system of claim 9, wherein said heat exchanger is formed from an alloy.

11. The cooling system of claim 9, wherein said heat exchanger is formed from aluminum.

12. The cooling system of claim 9, wherein said heat exchanger is formed from copper.

13. A cooling system for a semiconductor die carrier comprising:

a cooling fan disposed at a substantial distance from a semiconductor die carrier;

a cooling duct comprising an inlet portion and an outlet portion, said cooling duct inlet portion attached to said cooling fan; and a heat exchanger disposed on an upper surface of the semiconductor die carrier, wherein said cooling duct outlet portion is disposed in close proximity to said heat exchanger such that said cooling fan draws ambient air into said cooling duct and said ambient air exits said cooling duct outlet portion and passes in a heat exchange relationship with said heat exchanger, said heat exchanger comprising a contact portion and heat dissipating extensions, said contact portion adapted to contact said upper surface of the semiconductor die carrier, said heat dissipating extensions comprising a plurality of fins comprising first and second groups of fins, said first group of fins oriented perpendicularly with respect to said second group of fins, said first group of fins comprise fins of a first length interspersed between fins of a second length, said first length being shorter than said second length, each of said first group of fins comprises first and second ends, the first ends of said first group of fins being disposed in a curvilinear array.

14. The cooling system of claim 13, wherein said cooling duct outlet portion is disposed upstream of and adjacent to an edge of said heat exchanger.

15. The cooling system of claim 14, wherein the second ends of said first group of fins are disposed in a curvilinear array.

16. The cooling system of claim 15, wherein said ambient air exits said cooling duct outlet portion in a direction parallel to said upper surface of the semiconductor die carrier.

17. The cooling system of claim 13, wherein said heat dissipating extensions are parallel to the flow of the air.

* * * * *